US011721953B2

(12) United States Patent
Jayaraman et al.

(10) Patent No.: US 11,721,953 B2
(45) Date of Patent: Aug. 8, 2023

(54) ELECTRICALLY PUMPED VERTICAL CAVITY LASER

(71) Applicants: Thorlabs, Inc., Newton, NJ (US); Praevium Research, Inc., Santa Barbara, CA (US)

(72) Inventors: Vijaysekhar Jayaraman, Goleta, CA (US); Stephen Segal, Columbia, MD (US); Kevin Lascola, Columbia, MD (US)

(73) Assignees: Thorlabs, Inc., Newton, NJ (US); Praevium Research, Inc., Goleta, CA (US)

( * ) Notice: Subject to any disclaimer, the term of this patent is extended or adjusted under 35 U.S.C. 154(b) by 793 days.

(21) Appl. No.: 16/595,891

(22) Filed: Oct. 8, 2019

(65) Prior Publication Data
US 2020/0112140 A1    Apr. 9, 2020

Related U.S. Application Data

(60) Provisional application No. 62/742,637, filed on Oct. 8, 2018.

(51) Int. Cl.
*H01S 5/183* (2006.01)
*H01S 5/34* (2006.01)
(Continued)

(52) U.S. Cl.
CPC .......... *H01S 5/18327* (2013.01); *G01J 3/108* (2013.01); *H01S 5/042* (2013.01); *H01S 5/0612* (2013.01);
(Continued)

(58) Field of Classification Search
CPC .... H01S 5/18327; H01S 5/042; H01S 5/0612; H01S 5/0651; H01S 5/101; H01S 5/1014;
(Continued)

(56) References Cited

U.S. PATENT DOCUMENTS 6,320,893 B1 * 11/2001 Ueki ................... H01S 5/18355
372/45.01
6,404,791 B1     6/2002 Yang
(Continued)

FOREIGN PATENT DOCUMENTS

WO        00/45483 A1    8/2000
WO     2012082523 A2    6/2012

OTHER PUBLICATIONS

Veerabathran et al., "Room-temperature vertical-cavity surface-emitting lasers at 4 μm with GaSb-based type-II quantum wells", Applied Physics Letters, Feb. 14, 2017, pp. 1-5, vol. 110, No. 071104, AIP Publishing.
(Continued)

*Primary Examiner* — Yuanda Zhang
(74) *Attorney, Agent, or Firm* — Myers Wolin, LLC

(57) ABSTRACT

Disclosed is an electrically pumped vertical cavity laser structure operating in the mid-infrared region, which has demonstrated room-temperature continuous wave operation. This structure uses an interband cascade gain region, two distributed mirrors, and a low-loss refractive index waveguide. A preferred embodiment includes at least one wafer bonded GaAs-based mirror.

54 Claims, 11 Drawing Sheets

(51) Int. Cl.
    *H01S 5/042*     (2006.01)
    *H01S 5/065*     (2006.01)
    *H01S 5/343*     (2006.01)
    *G01J 3/10*     (2006.01)
    *H01S 5/06*     (2006.01)
    *H01S 5/10*     (2021.01)

(52) U.S. Cl.
    CPC ............ *H01S 5/0651* (2013.01); *H01S 5/101* (2013.01); *H01S 5/1014* (2013.01); *H01S 5/18313* (2013.01); *H01S 5/18347* (2013.01); *H01S 5/18366* (2013.01); *H01S 5/18377* (2013.01); *H01S 5/3402* (2013.01); *H01S 5/343* (2013.01); *H01S 5/3422* (2013.01); *H01S 5/34306* (2013.01)

(58) Field of Classification Search
    CPC ............. H01S 5/18313; H01S 5/18347; H01S 5/18366; H01S 5/18377; H01S 5/3402; H01S 5/3422; H01S 5/343; G01J 3/108
    See application file for complete search history.

(56) References Cited

U.S. PATENT DOCUMENTS

| | | | |
|---|---|---|---|
| 2012/0032227 | A1 | 2/2012 | Seabaugh et al. |
| 2014/0049777 | A1* | 2/2014 | Sun .................... G01N 21/39 356/409 |
| 2014/0376585 | A1 | 12/2014 | Kub et al. |
| 2016/0028207 | A1 | 1/2016 | Cable et al. |
| 2017/0125979 | A1 | 5/2017 | Yang et al. |
| 2019/0044304 | A1* | 2/2019 | Jayaraman .............. H01S 5/041 |

OTHER PUBLICATIONS

Vurgaftman et al.,"Mid-IR Type-II Interband Cascade Lasers", IEEE Journal of Selected Topics in Quantum Electronics, Sep./Oct. 2011, pp. 1435-1444, vol. 17, No. 5, IEEE.

Belenky et al., "Type-I Diode Lasers for Spectral Region Above 3 µm", IEEE Journal of Selected Topics in Quantum Electronics, Sep./Oct. 2011, pp. 1426-1434, vol. 17, No. 5, IEEE.

Cole et al. "High-performance near- and mid-infrared crystalline coatings", Optica, Jun. 13, 2016, pp. 647-656, vol. 3, No. 6, Optical Society of America.

Bewley et al."Continuous-wave interband cascade lasers operating above room temperature at λ=4.7-5.6 µm", Optics Express, Jan. 26, 2012, pp. 3235-3240, vol. 20, No. 3, Optical Society of America.

Hegblom et al., "Estimation of scattering losses in dielectrically apertured vertical cavity lasers", Applied Physics Letters, Mar. 25, 1996, pp. 1757-1759, vol. 68, No. 13, American Institute of Physics.

Sprengel et al., "InP-Based Type-II Quantum-Well Lasers and LEDs", IEEE Journal of Selected Topics in Quantum Electronics, Jul./Aug. 2013, vol. 19, No. 4, IEEE.

Bewley et al. "Room-temperature mid-infrared interband cascade vertical-cavity surface-emitting lasers", Applied Physics Letters, 2016, pp. 1-19, No. 109 American Institute of Physics.

Jayaraman et al. "Room temperature continuous wave mid-infrared VCSEL operating at 3.35 µm", SPIE OPTO, Jan. 29, 2018, Proceedings vol. 10552, San Francisco, CA, USA.

Wolfgang Drexler and James Fujimoto, "Optical Coherence Tomography: Principles and Applications," Chapter 23, 2015 2nd edition.

International Search Report issued by the International Searching Authority for corresponding International Patent Application No. PCT/US 2019/055141, dated Apr. 9, 2020.

Written Opinion of the International Searching Authority issued by the International Searching Authority for corresponding International Patent Application No. PCT/US 2019/055141, dated Apr. 9, 2020.

The extended European search report with the European search opinion issued for European Patent Application No. 19871239.0, dated Jun. 29, 2022.

Bewley, W.W. et al. "Room-temperature mid-infrared interband cascade vertical-cavity surface-emitting lasers", Applied Physics Letters, Oct. 12, 2016, pages, vol. 109, No. 15, American Institute of Physics, Melville, NY, USA.

Jayaraman, V. et al., "Room temperature continuous wave mid-infrared VCSEL operating at 3.35 [mu]m", Proceedings of SPIE, Feb. 19, 2018, p. 105520B, vol. 10552, ISBN: 978-1-5106-1533-5.

Veerabathran G. K. et al. "room-temperature vertical-cavity surface-emitting lasers at 4[mu]m with GaSb-based type-II quantum wells", Applied Physics Letters, Feb. 14, 2017, pp. 1-5, vol. 110, No. 071104, American Institute of Physics, Melville, NY, USA.

Hadley, G. Ronald, "Effective index model for vertical-cavity surface-emitting lasers", Optics Letters, Jul. 1, 1995, p. 1483-1485, vol. 20, No. 13.

Segal, Stephen R. et al. "Tunable Mid-infrared VCSELs for Methane Detection", Advanced Photonics, Jul. 2, 2018, p. IM4B.3(1-2), ISBN: 978-1-943580-43-9.

Bewley W.W. et al., "Mid-Infrared Vertical-Cavity surface-Emitting Lasers for Chemical Sensing", Applied Optics, Mar. 20, 1999, pp. 1502-1505; vol. 38, No. 9. Optical Society of America, Washington, DC, USA.

* cited by examiner

ELECTRICALLY PUMPED VERTICAL CAVITY LASER

CROSS REFERENCES TO RELATED APPLICATIONS

This application claims the benefit of U.S. Provisional Patent Application No. 62/742,637 filed on Oct. 8, 2018. The disclosure and entire teachings of U.S. Provisional Patent Application 62/742,637 are hereby incorporated by reference.

STATEMENT REGARDING FEDERALLY SPONSORED RESEARCH OR DEVELOPMENT

This invention was made with Government support under contract number DE-AR0000538 awarded by DOE, Office of ARPA-E. The Government has certain rights in this invention.

FIELD OF THE INVENTION

This invention relates generally to mid-infrared semiconductor lasers, tunable mid-infrared semiconductor lasers, and vertical cavity lasers.

BACKGROUND

Achieving room-temperature continuous-wave (RTCW) vertical cavity laser (VCL) or vertical cavity surface emitting laser (VCSEL) operation at wavelengths beyond about 3.0 microns (um) is preferable for viable devices for most commercial applications. For example, many scenarios involving spectroscopy require continuous monitoring. The semiconductor materials necessary for mid-IR operation of a VCL in the spectroscopically important 3-7 um range are part of the Gallium Antimonide (GaSb) material system, grown on GaSb substrates, or alternatively, part of the closely related InAs material system grown on InAs substrates. Achieving RTCW mid-IR VCL operation presents severe challenges, due to various limitations of these materials. Type I InGaAsSb quantum wells in this material system, employing AlGaAsSb or AlInGaAsSb barriers, suffer from decreasing hole confinement as emission wavelength is pushed beyond 3.0 um. This makes the more thermally sensitive VCL geometry especially challenging, though edge-emitting lasers have been achieved with type I quantum wells beyond 3.0 um, as described in "Type I Diode Lasers for Spectral Region Above 3.0 um," by G. Belenky, et al, *IEEE Journal of Selected Topics in Quantum Electronics*, vol. 17. No. 5, September/October 2011. The most robust approach to achieving 3-7 um operation is through the use of type II quantum well interband cascade laser (ICL) gain regions, which use electron recycling as originally described in "Type II and type I interband cascade lasers," by J. Meyer, et al *Electronics Letters*, vol. 32, no. 1 Jan. 4, 1996. These devices have demonstrated CW operation above room temperature at wavelengths from at least 3.0-5.6 um, as described in "Mid-IR Type II Interband Cascade Lasers," by I. Vurgaftman, et al in *IEEE Journal of Selected Topics in Quantum Electronics*, vol. 17, no. 5, September/October 2011 and in "Continuous wave interband cascade lasers operating above room temperature at X=4.7-5.6 um," by W. Bewley, et al in *Optics Express*, vol. 20, no. 3, Jan. 30, 2012, pp. 3235-3240. Type II ICL structures grown on InAs substrates have also shown promise, as described in "Low-threshold InAs-based interband cascade lasers operating at high temperatures," by L. Li, et al in *Applied Physics Letters*, 106 (25), pp. 251102-1-251102-4. We also note that ICL gain regions can encompass parallel cascade quantum well devices, which include multiple quantum wells in each active stage, as described for example by "Parallel Cascade Quantum Well Light Emitting Device," by R. Yang in U.S. Pat. No. 6,404,791 B1.

The promise of type II quantum wells based on the GaSb material system has spurred efforts at CW VCL operation using type gain II regions targeting >3 um wavelength. As of August 2018, however, electrically pumped VCLs (eVCLs) had achieved only room temperature pulsed operation above 3.0 um. Two state of the prior art results are described in "Room-temperature Mid-Infrared Interband Cascade Vertical Cavity Surface Emitting Lasers," by W. W. Bewley et al in *Applied Physics Letters* 109, 151108 (2016), and in "Room-temperature vertical cavity surface emitting lasers at 4 um with GaSb-based type II quantum wells," by G. K. Veerabathran, et al in *Applied Physics Letters* 110, 071104 (2017). An optically pumped structure employing GaAs/AlGaAs mirrors and type I quantum wells recently achieved RTCW operation, as described "Room-temperature continuous wave mid-infrared VCSEL operating at 3.35 um" by Jayaraman, et al, in *Proceedings of the SPIE* 10552: *Vertical Cavity Surface Emitting Lasers XXII*, pp. 105520B1-B7, February 2018. Although optically pumped structures are commercially valuable, electrically pumped devices provide the ultimate low-cost solution, and are therefore necessary for high-volume, price-sensitive applications.

The two leading electrically pumped VCL results referenced above suffer from a number of limitations which preclude room temperature continuous wave (RTCW) operation. The work of Bewley, et al employed an interband cascade laser (ICL) gain region. The ICL-based VCL work of Bewley, et al, however, did not achieve RTCW operation, in part because of high operating voltage due to a large cascade of 15 active stages, and multiple heterobarriers encountered in driving current through the GaSb/AlAsSb mirror. The high voltage produced excess device heating. In addition, high intra-cavity losses increased required operating current, reduced device efficiency, and exacerbated the heat generation problem. The high intra-cavity losses resulted from the absence of a low-loss refractive index waveguide in the VCL structure, which is necessary to reduce sidewall scattering losses from deep-etched structures, and to reduce absorption/scattering losses arising from the contact metal interaction with the optical mode. The work of Veerabathran, et al, used a type II multi-quantum well gain region in a p-i-n structure with a tunnel junction, which does not work as well as the ICL gain region since the cascade of the ICL enables more uniform current injection with large numbers of wells, and recycling of charge carriers. Nevertheless, Veerabathran, et al did employ a low-loss refractive index waveguide in the form of a buried tunnel junction (BTJ), which also doubled as a current aperture. This improved performance, but this work also did not achieve RTCW lasing, and maximum CW operating temperature was limited to −7C. The BTJ is not an option as a current aperture in the ICL-based VCL, since the latter does not employ a p-i-n injection scheme, but instead only n-type charge injection.

Several options for efficient current injection and low optical loss waveguiding exist in near-infrared VCSELs. Two of the most popular prior art options are ion implantation and lateral oxidation. Ion implantation provides current aperturing, by creating resistive regions through implantation of protons, which funnel the current into small non-implanted areas where it can interact efficiently with the optical mode. Proton implantation is largely ineffective at increasing resistance in the GaSb/InAs material system necessary for mid-infrared, however. Workers in GaAs-based VCSELs operating between about 630 nm and 1150 nm also routinely employ lateral oxidation of AlAs or high aluminum containing AlGaAs to simultaneously create an optical waveguide and a current aperture for low threshold current devices. The GaSb and InAs material systems employed at wavelengths>3 um, however, do not contain any material which can be efficiently oxidized like AlGaAs or AlAs. Lastly, current aperturing schemes in NIR VCSELs are typically employed adjacent the quantum wells, and minimal carrier spreading in the quantum wells is assumed. With ICL gain regions lateral carrier spreading can be severe in the InAs layers present in the cascade regions. So even if approaches like oxidation, ion implantation, or buried tunnel junction could be employed in the GaSb/InAs material systems, they are likely to be less effective at current aperturing due to excess carrier spreading under the current aperture. In summary, implementation of low-loss index guiding and efficient current aperturing in the GaSb or InAs material requires innovation, rather than simple adoption of techniques that have been successful in the near infrared.

From the foregoing, it is clear that what is required is an electrically pumped mid-IR VCL structure that employs an efficient mid-infrared gain region, generates minimal excess heat through low voltage operation, and provides sufficiently low optical loss waveguiding and sufficiently efficient current injection to enable RTCW operation.

SUMMARY

The present invention describes the first RTCW electrically pumped VCL structure operating at a wavelength greater than 3.0 um, employing means for efficient current injection and low-loss optical waveguiding. In the preferred embodiment, the present invention employs an ICL gain region in conjunction with at least one GaAs-based mirror, with a low-loss optical waveguide which can be implemented as an undercut layer, a laterally oxidized AlGaAs layer in a wafer bonded GaAs/AlGaAs mirror, a stepped surface or shallow mesa, a curved surface, or a tapered oxide layer. In some embodiments, the optical waveguide also provides some degree of current confinement, but in other preferred embodiments, the waveguide does not provide any current confinement, but other portions of the structure still allow for sufficient current confinement to enable RTCW operation. Efficient current injection is accomplished by minimizing the injection contact area and providing for etching through active stages to minimize current spreading. In the preferred embodiment the structure is electrically pumped with first and second injection contacts, with no injection required through mirror layers, reducing device voltage and device heating, and promoting RTCW operation. Also in the preferred embodiment, the VCL gain region employs 10 or fewer active stages in an ICL configuration, further reducing device voltage relative to previous workers employing 15 stages.

DETAILED DESCRIPTION OF THE PREFERRED EMBODIMENTS

Figure 1:
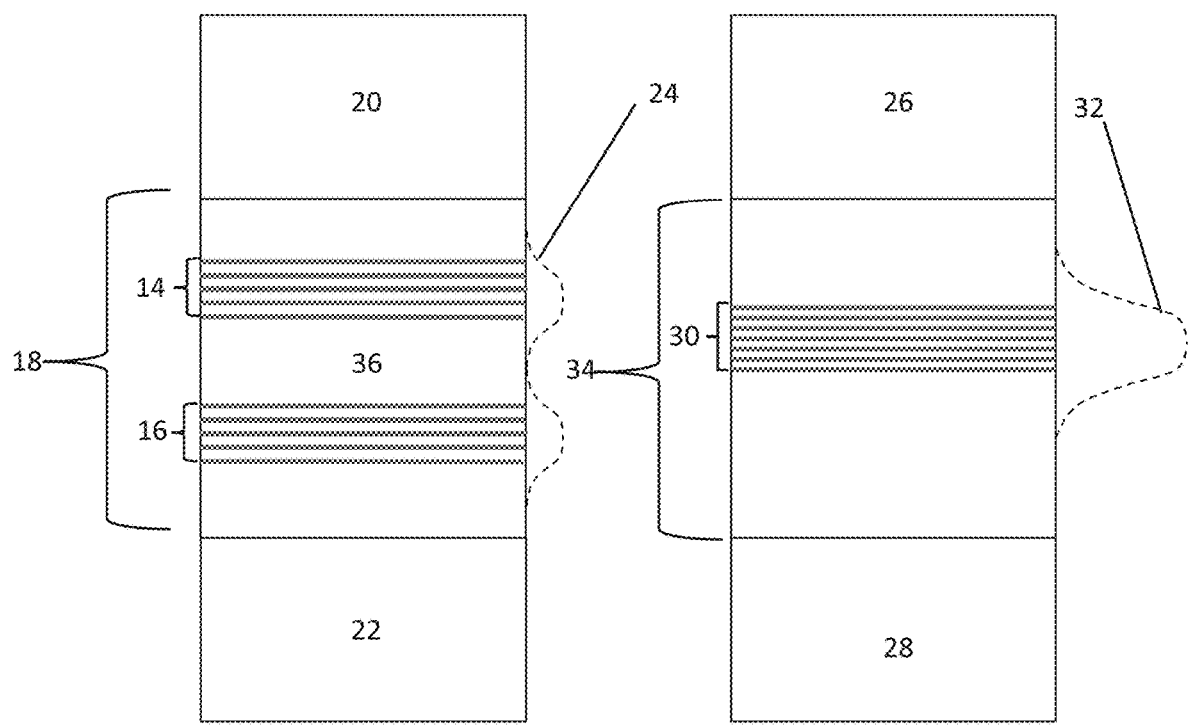
FIG. 1 shows epitaxial cross-sections of two preferred embodiments of the present invention, including 7 active stages on a single standing wave peak, and 2 groups of 5 active stages on two standing wave peaks.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

In the preferred embodiment of the present invention, the operating wavelength of the VCL is 3-7 um, or the wavelength range in which ICL gain regions based on the GaSb material system provide efficient optical gain. FIG. 1 illustrates epitaxial cross sections of two preferred embodiments of the present invention. In a first embodiment, a VCL comprises a first ICL gain region 18, a top mirror 20, and a bottom mirror 22. The ICL gain region 18 comprises a first set of 5 active stages 14 and a second set of 5 active stages 16, aligned with separate peaks of an optical standing wave pattern 24, and separated by a spacer layer 36 which includes GaSb. In general, a stage comprises an active type II quantum well, along with an injector region, but more than one quantum well per stage could be employed. In another preferred embodiment, an ICL gain region 34 comprises a single set of 7 active stages 30, aligned with a single peak of a standing wave pattern 32. Top mirror 26 and bottom mirror 28 complete the VCL cavity. FIG. 1 shows two representative numbers of stages—the preferred number of stages in the ICL VCL of the present invention is in the range of 5-10.

Figure 2:
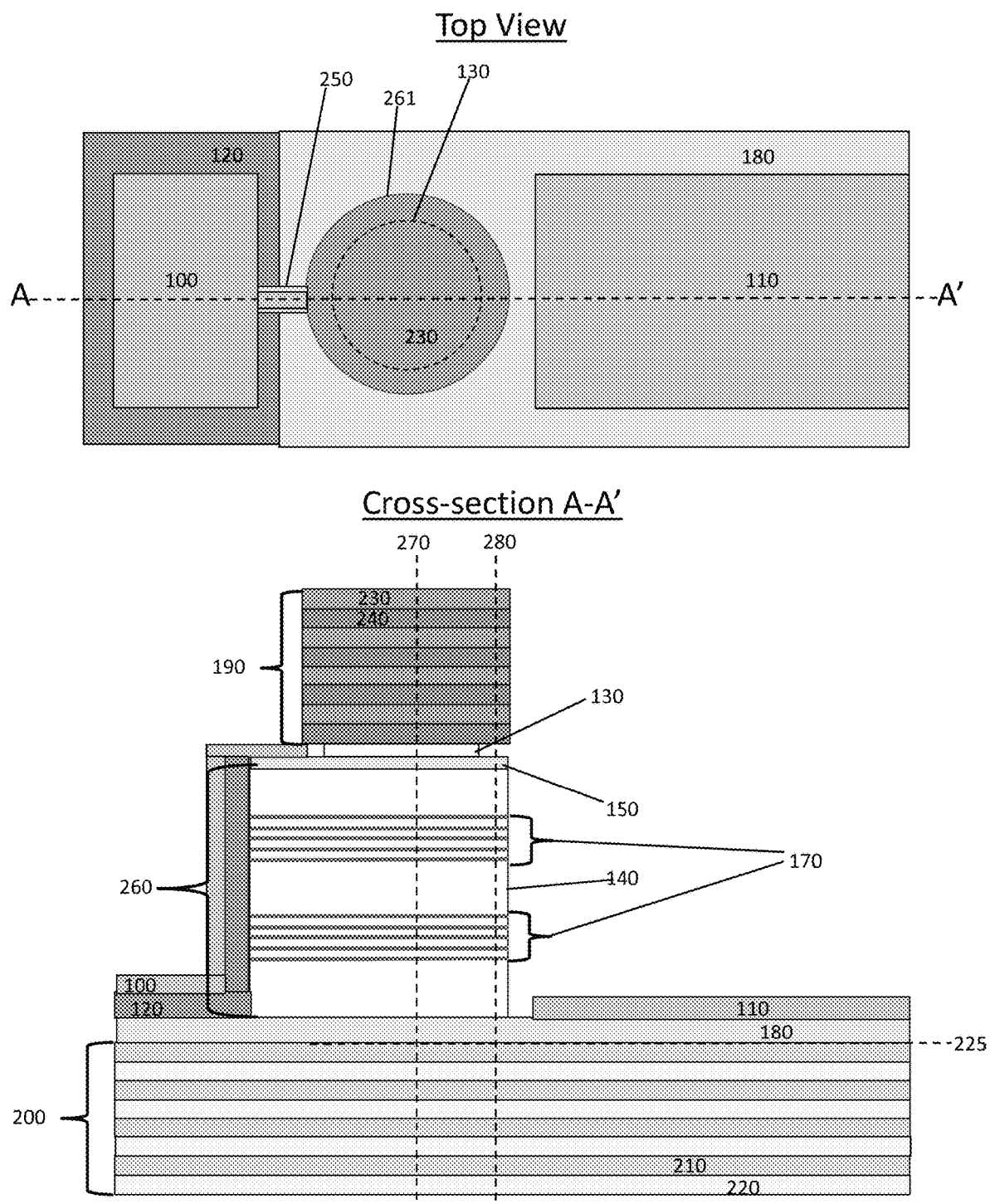
FIG. 2 shows top and cross-sectional views of an electrically pumped vertical cavity laser in accordance with the present invention.
Figure 3:
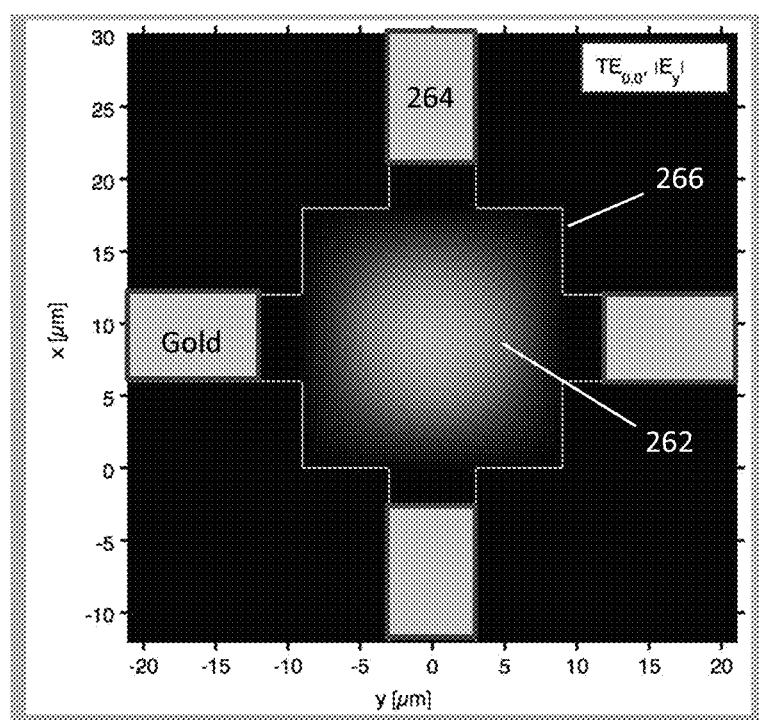
FIG. 3 shows a mesa with 4 tabs and a calculated two-dimensional optical mode profile.

FIGS. 2-11 illustrate several preferred embodiments of an electrically pumped vertical cavity laser according to the present invention. FIG. 2 shows top and cross-sectional views of a first preferred embodiment of a fixed wavelength electrically pumped VCL according to the present invention. The VCL of FIG. 2 comprises an ICL gain region 260 with two groups of 5 stages 170, although other numbers of stages less than 10 could be employed, such as shown in FIG. 1. A bottom mirror 200 of this structure is comprised of alternating layers of GaAs (210) and AlGaAs (220), and is wafer bonded to the GaSb-based ICL gain region 260, analogous to the optically pumped mid-IR VCSEL described in "Room-temperature continuous wave mid-infrared VCSEL operating at 3.35 um" by Jayaraman, et al, in *Proceedings of the SPIE* 10552: *Vertical Cavity Surface Emitting Lasers XXII*, pp. 105520B1-B7, February 2018. Gain region 260 and mirror 200 are joined at a wafer-bonded interface 225. The entire structure rests on a GaAs substrate, which is not shown, below the mirror 200. Previous optically pumped RTCW results referenced above demonstrated the low optical loss of the GaAs/AlGaAs mirror in the mid-infrared, as did the paper "High performance near- and mid-infrared crystalline coatings," by G. D. Cole et al, and *Optica* vol. 3, issue 6, pp. 647-656 (2016). These mirrors also have large refractive index contrast, correspondingly large bandwidth, and have excellent thermal conductivity, as is well-known to those skilled in the art of NIR VCSELs. Additionally, these GaAs/AlGaAs mirrors can be grown with the requisite large thicknesses and high surface quality on large 6-inch substrates, so are commercially attractive for volume production of mid-IR VCLs. Alternate preferred embodiments, however, could use either epitaxially grown or wafer-bonded mirrors grown on GaSb substrates, such as alternating layers of GaSb/AlAsSb, which also provide high refractive index contrast. Although GaAs/AlGaAs is preferred for the bottom mirror, those skilled in the art recognize that two different compositions of Al(x)Ga(1−x)As where 0≤x≤1 could be employed, depending on index contrast and mirror bandwidth desired. A top mirror 190 of this structure preferably uses alternating layers of Zinc Selenide (ZnSe) and Thorium Flouride (ThF4), shown as layers 240 and 230 respectively, although other combinations such as Germanium (Ge) and Zinc Sulfide (ZnS) could also be employed. Another wafer bonded GaAs/AlGaAs mirror could also be employed as the top mirror. We note that in this and subsequent figures, the number of mirror periods has been reduced relative to an actual design, for simplicity of drawing. A typical number of mirror periods is about 36 for the GaAs/AlGaAs mirror and about 9 for the ZnSe/ThF4 mirror. The number of required periods for efficient VCL operation can be calculated by those skilled in the art of VCLs. In the VCL of FIG. 2, current flows from a top injection contact 100 contacting a top InAsSb contact layer 150 to a bottom injection contact 110 contacting a bottom InAsSb contact layer 180, and does not flow through any mirror layers. Current confinement is provided by a deep-etched mesa 140 which is etched through both sets of 5 active stages. A silicon nitride layer 120 provides insulation along the sidewall of the mesa 140, enabling the contact 100 to come down to a large area pad region, underneath which the silicon nitride layer 120 also extends. Since a deep etched mesa like 140 is known to provide high scattering loss, a shallow mesa 130 is included inside of the deep-etched mesa 140, which provides low loss mode confinement and pulls the optical mode away from the lossy sidewalls of the deep etched mesa 140. We note that the shallow mesa 130 could be implemented as a stepped surface buried at the wafer bonded interface between the GaAs mirror 200 and the ICL gain region 260. That is, a mesa could be etched for example into the GaAs mirror before wafer bonding, creating the buried stepped surface or alternately buried shallow mesa. The layers 230 and 240 of the top mirror 190 will be conformal with the mesa 130 when deposited. Since the optical mode of this VCL is substantially confined to the area of the shallow mesa 130, and the area of current injection is confined by the larger deep etched mesa 140, some injected current does not overlap with the optical mode and the efficiency of current injection is reduced. Nevertheless, the amount of wasted current can be minimized, as well as optical losses induced by the contact metal, by judicious choice of the mesa 140 geometry, which includes both a circular portion 261 and a protruding tab portion 250. The top metal 100 is restricted to remain on the tab region and not encroach on the circular part of the mesa. The optical mode will follow the circular shallow mesa region of the layer 130, and not impinge on the tab where the contact metal 100 resides. This method is especially well suited to the GaSb material system employed at mid-IR, since the InAsSb contact has excellent electrical conductivity, and current will spread efficiently to the region under the shallow mesa 130. Note that one tab is shown for illustrative purposes only, and multiple tabs or tabs of different size and shape could be employed. FIG. 3 shows another preferred implementation showing a mesa 266 with a central square section and 4 tab regions 264 metallized with gold. A calculated confined mode 262 does not have any substantial energy in the metallized tab regions. We could generalize the circle/tab or square/tab geometry of FIGS. 2 and 3 as a mesa whose top view perimeter contains one or more inflection points. That is, the curve consisting of the top-view perimeter of the mesa has at least one tangent that crosses the curve. In practice every mesa will have a curved surface, since a square corner like in FIG. 3 will actually be curved when implemented by conventional photolithography.

The efficiency of current injection of a typical circle/tab geometry can be calculated by considering a typical geometry, verified by 2-D waveguide simulation methods well-known to those skilled in the art to provide a fundamental optical mode that is well away from lossy deep-etched sidewalls or metal contacts. For example, a typical single-mode size at 3.3 um is around 25 um diameter, corresponding to the diameter of the shallow etched mesa 130. This corresponds to a mode diameter that is about 7.57 times the wavelength 3.3 um. A preferred range of mode diameters for an electrically pumped vertical cavity laser according to the present invention, measured in multiples of the emission wavelength, is about 4-9. The deep etch need only be about 2-3 um larger radius or around 30 um diameter in this case. The tab region 250 can be about 8×8 um. In this geometry, the area of the optical mode is about 491 um, and the area of the entire mesa including tab region is 771 um, resulting in an areal injection efficiency of $(491/771)^2 = ~64\%$. This 64% efficiency, while not as good as near IR VCSELs, is still sufficient to enable RTCW operation. In general, a ratio of optical mode to total injection area >0.25 is desirable for RTCW operation, and is easily achievable for single mode devices.

Figure 4:
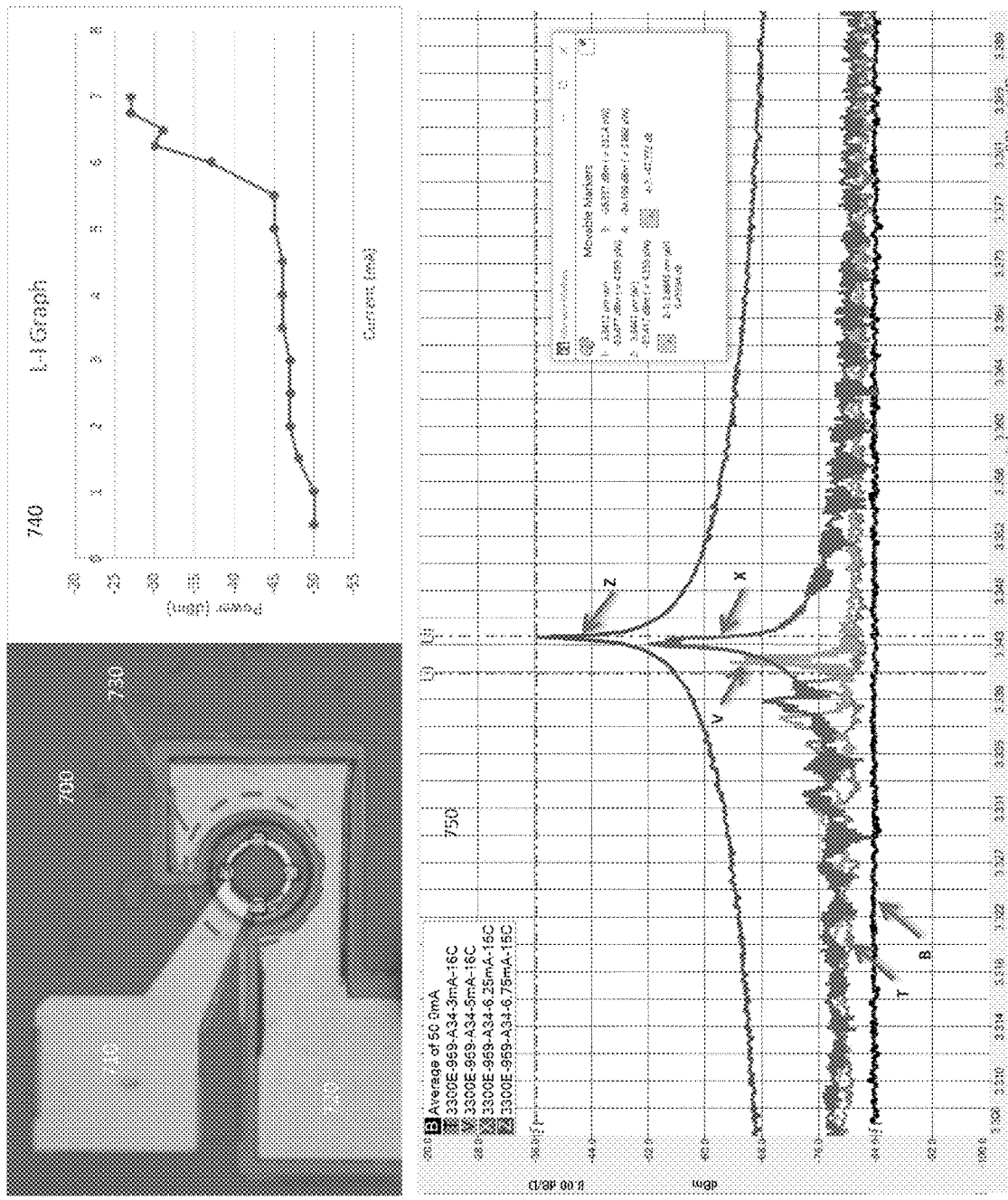
FIG. 4 shows device geometry, light out vs. current curve, and RTCW optical spectra of an electrically pumped VCL according to the present invention.
Figure 5:
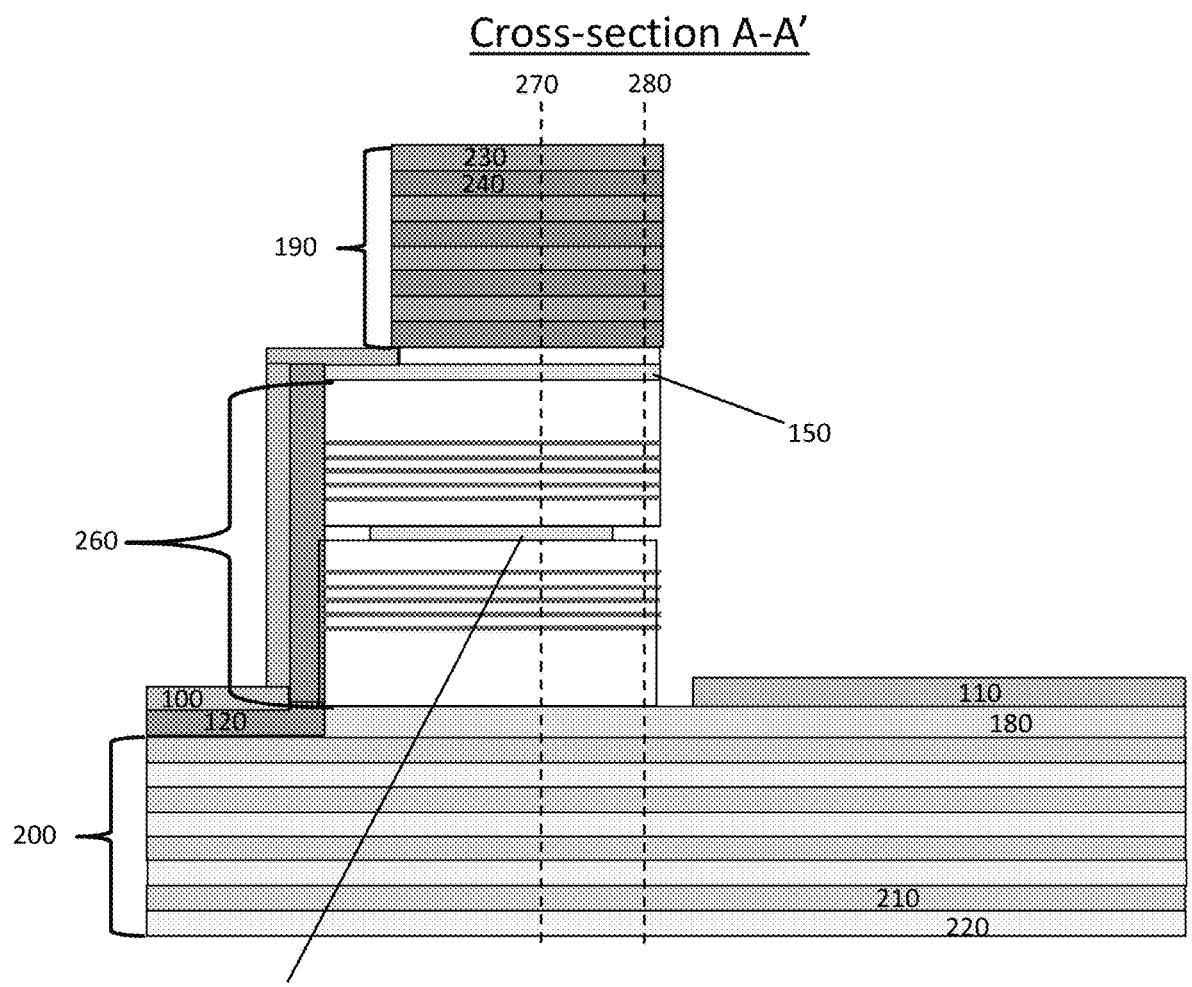
FIG. 5 shows a cross-sectional view of an electrically pumped vertical cavity laser with an undercut layer for low-loss optical confinement in accordance with the present invention.

FIG. 4 shows the geometry and measured results of the first RTCW mid-IR eVCSEL ever made. As shown by a top-view photograph 700 (similar device to one actually measured, but not the same device), taken before deposition of the top mirror, the geometry is of the type described by FIG. 2, with a top injection contact 710, which runs up the side of a mesa, and a bottom injection contact 720. A mesa region within a dashed circle 730 comprises a deep etched mesa with circular central region and 4 metallized tabs, and shallower etched central mesa region. FIG. 4 shows measured data at 16C on a device with a geometry of the same type as that shown in the photograph 700, but with different dimensions. FIG. 4 shows an L-I curve 740, measured by looking at integrated power in an optical spectrum analyzer, and plotted in a log-log fashion. The integrated power represents actual power in arbitrary units, as coupling into the OSA has an unknown loss, but the sharp threshold is a key indication of lasing. This shows a threshold current around 6 mA. FIG. 5 also shows spectra 750, at various currents, indicating a large jump in spectral peak beyond 6 mA drive current, which is another indication of lasing. In the device actually measured to produce the L-I curve 740 and optical spectra 750, the diameter of the shallow etch mesa was about 20 um, the diameter of the deep etched mesa about 24 um, and area of each metallized tab about 110 um². This leads to an areal injection ratio of about 0.35, showing that RTCW lasing is possible with lower injection efficiency than commonly employed in NIR VCL devices.

The etch depth of the shallow mesa 130 in FIG. 2, if placed inside the cavity between the mirrors, should ideally be less than a quarter wavelength of the emission wavelength divided by the refractive index of the etched material. For example, if the etched material is GaSb with a refractive index of 3.77, then at 3.3 um emission wavelength, the mesa step should preferably be less than (¼) of 3.3/3.77, or less than about 0.22 um. This results in low scattering loss. Note the effect of the etch depends on its exact position—intra-cavity or inside the mirrors, or positioned at a standing wave peak or standing wave null. It also depends on the type of mirror used. If two GaAs/AlGaAs mirrors are employed, then a particular etch depth will cause less scattering loss than if one GaAs/AlGaAs mirror and one ZnSe/ThF4 mirror is employed, since the former choice places more of the optical standing wave in the mirrors and the effect of an intra-cavity etch is reduced.

Since the etch placement determines its effect on guiding the optical mode, and also because other low-loss guiding mechanisms could be employed which employ multiple layers instead of one, it is important to establish a measure of waveguiding that is independent of the exact implementation. One useful measure is the difference in distributed refractive index between the inner etched (or oxidized as in FIG. 6 below) region and the outer non-etched/non-oxidized region. The inner and outer regions are analogous to the core and cladding, respectively, of a conventional waveguide. This method is employed in "Estimation of scattering losses in dielectrically apertured vertical cavity lasers," by E. R. Hegblom, et al, *Applied Physics Letters* vol. 68, no. 13, pp. 1757-1759, Mar. 25, 1996. With respect to FIG. 2, the inner distributed refractive index is the average refractive index calculated along the dashed line 270, axially weighted by the strength of the optical standing wave in the cavity. This axially weighted refractive index calculation is well-known to those skilled in the art of vertical cavity lasers. The outer distributed refractive index is calculated in FIG. 2 in a similar manner along the dashed line 280. For a low scattering loss waveguide the difference between inner and outer distributed refractive index should be less than about 0.12, and preferably around 0.02. The minimum value is more dependent on other details of the geometry, such as the placement of metal contacts and transverse dimension of the deep-etched mesa relative to that of the shallow etched mesa. The refractive index guiding, and therefore the minimum distributed refractive index difference, should be sufficient to ensure the optical mode is pulled away from lossy metal contacts and rough deep etched surfaces. This calculation is well-known to those skilled in the art, but the typically the minimum value should be greater than about 0.004. In some cases, such as in FIG. 5 below, the refractive index guide also coincides with a current aperture, in which case thermal lensing will enhance the structural refractive index guide, and it may be possible to tolerate values less than 0.004. The ultimate goal is to create a refractive index guide that reduces roundtrip losses due to transverse geometry (as opposed to intrinsic absorption and scattering losses in the layers of the structure). Roundtrip losses due to transverse geometry should ideally be <0.1%, and certainly <0.5%.

FIG. 5 illustrates an alternate preferred embodiment of an electrically pumped VCL according to the present invention, employing an undercut InAsSb or InAs layer 290 for refractive index waveguiding. This layer can be selectively undercut using for example a mix of citric acid and hydrogen peroxide, as is well-known to those skilled in the art. In this case, the undercut layer will also provide some measure of current confinement, so the structure promises to be very efficient, though the amount of current spreading above and below the aperture in the two groups of active stages, particularly in the InAs layers associated with the injector regions, will not be insignificant. Nevertheless, this structure promises to be more efficient than that of FIG. 2. If the undercut layer is more than about 0.1 um thick, this in combination with thermal lensing should provide good refractive index waveguiding. We note the undercut layer 290, as well as contact layers 150 and 180 are preferably placed at a node in the optical standing wave of the cavity.

Figure 6:
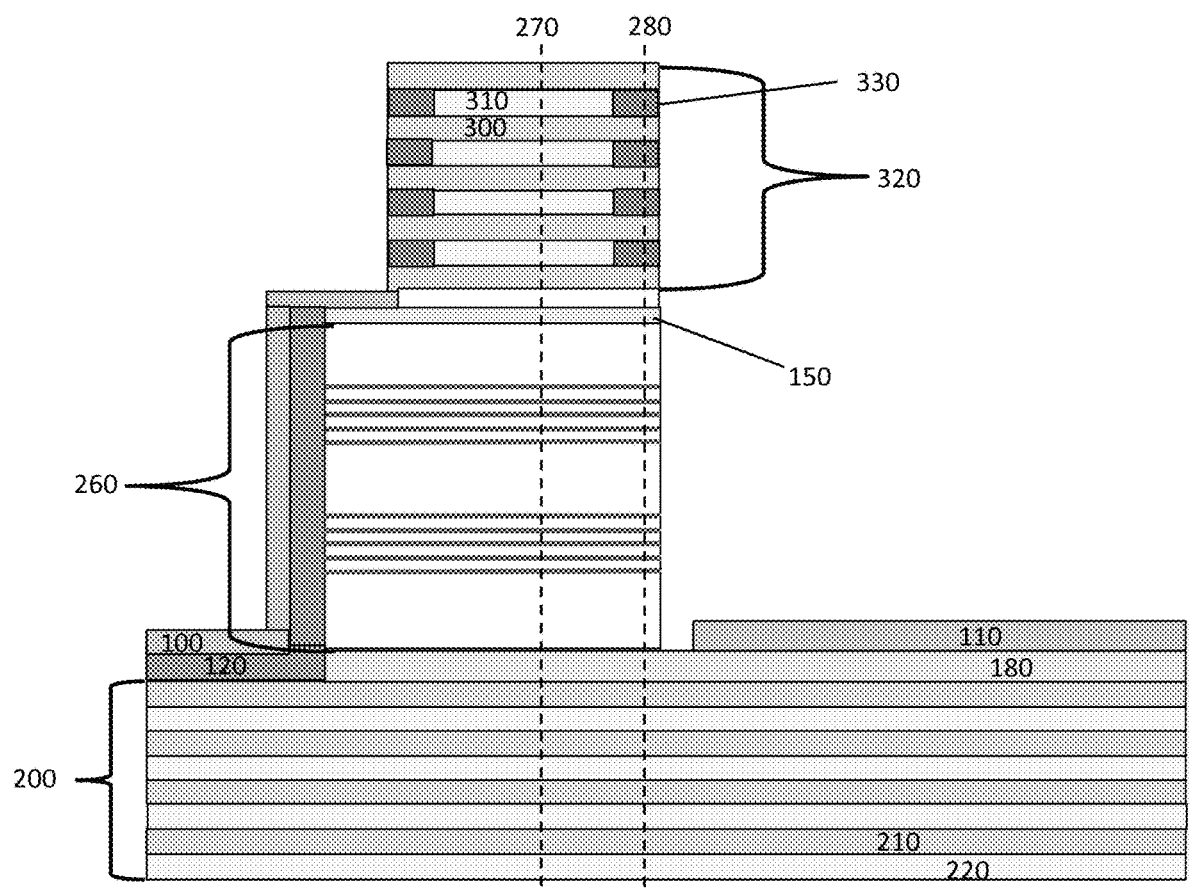
FIG. 6 shows a cross-sectional view of an electrically pumped vertical cavity laser with laterally oxidized layers for low-loss optical confinement in accordance with the present invention.

FIG. 6 illustrates another preferred embodiment of an electrically pumped VCL according to the present invention.

Here, waveguiding is provided by oxidizing one or more layers of a top wafer-bonded GaAs/AlGaAs mirror 320, comprising alternating GaAs (300) and AlAs (310) layers. The AlAs layers comprise laterally oxidized regions 330, where the AlAs is converted to AlxOy using a lateral oxidation process well-known to those skilled in the art of VCLs. Those skilled in the art recognize that the AlAs could also be implemented as high aluminum containing AlGaAs. Although multiple oxidized layers are shown, as little as one oxidized layer could be used. We also note that oxide layers could be tapered from wider thickness to zero-thickness as they come inward. In such a case we would define the distributed index difference as being at the outer edge of the taper.

Figure 7:
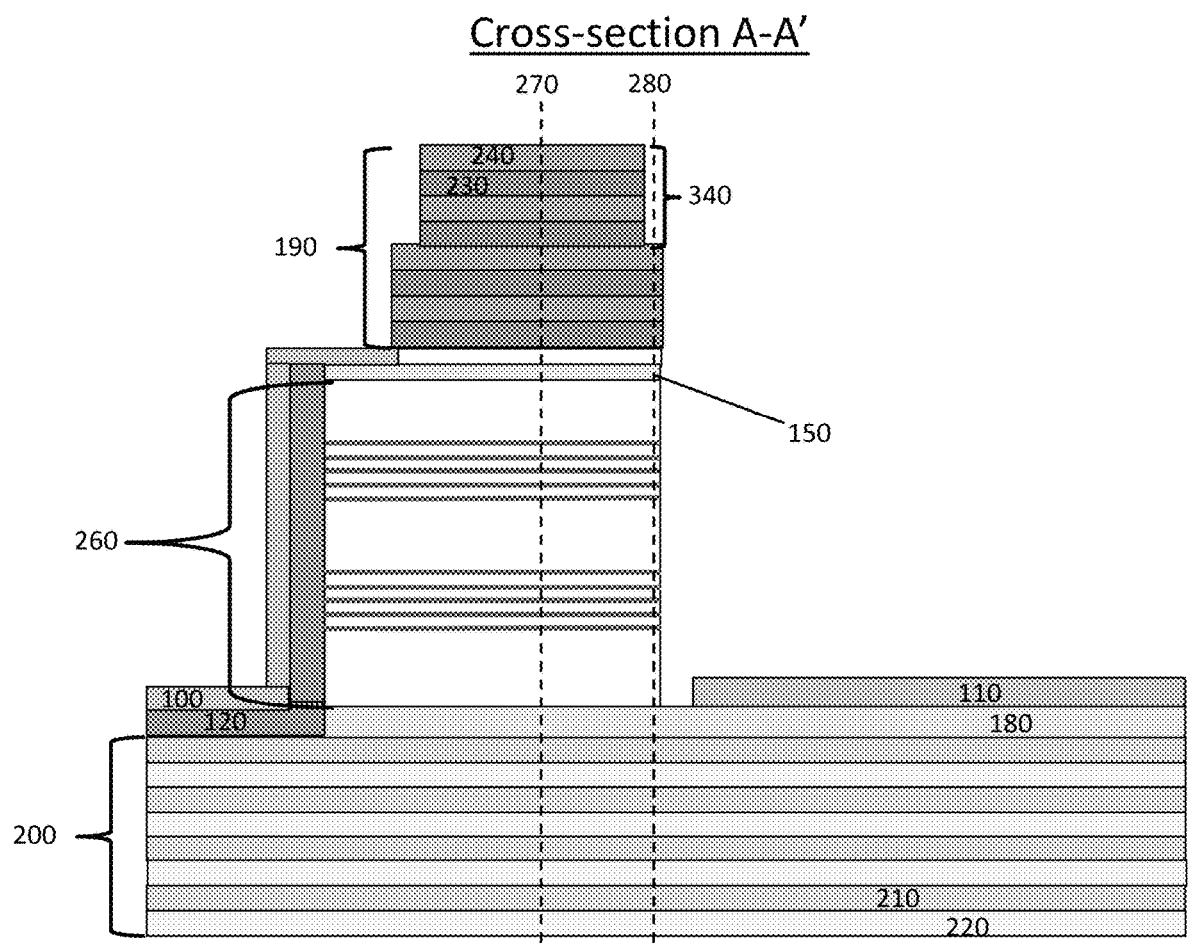
FIG. 7 shows a cross-sectional view of an electrically pumped vertical cavity laser with partially etched top mirror for low-loss optical confinement in accordance with the present invention.

FIG. 7 illustrates another preferred embodiment of an electrically pumped VCL according to the present invention. Here waveguiding is provided by partially etching the top mirror 190 in a region 340. Although this etch is deep (several microns), it is far away from the optical mode, so the effect on roundtrip cavity loss can be made small. Those skilled in the art of VCLs can calculate how deep an etch is required to maintain a distributed index difference that is less than 0.12, and preferably in the range of 0.02.

Figure 8:
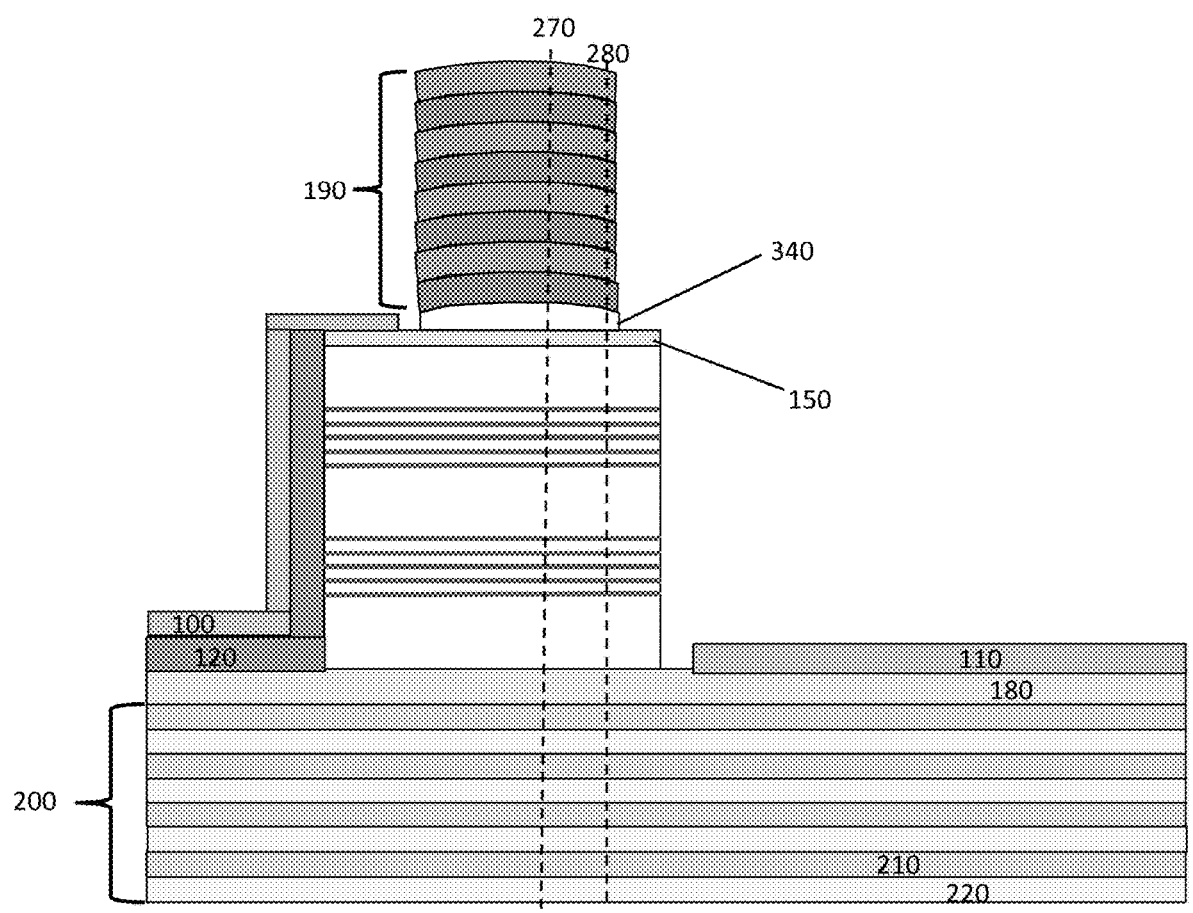
FIG. 8 shows a cross-sectional view of an electrically pumped vertical cavity laser with top mirror deposited on a curved surface for low-loss optical confinement in accordance with the present invention.

FIG. 8 illustrates another preferred embodiment of an electrically pumped VCL according to the present invention. Here, index guiding is provided by a curved surface in a layer 340, to which the top deposited mirror 190 will conform. This surface can be formed by pattern transfer of a reflowed photoresist into an underlying GaSb or InAsSb layer. Variations in etch chemistry can be used to control relative etch rates of photoresist and the semiconductor, to achieve the radius of curvature desired. Here we define the outer region of the distributed index difference calculation as being at the l/e radius of the optical mode, seeking to keep this difference <0.12. In this geometry, we can also seek to achieve a certain guided spot size, preferably in the range of 20-25 um for 3.3 um wavelength, and scaling with wavelength, and this can be related to the curvature of the mirror using known analytical techniques.

Figure 9:
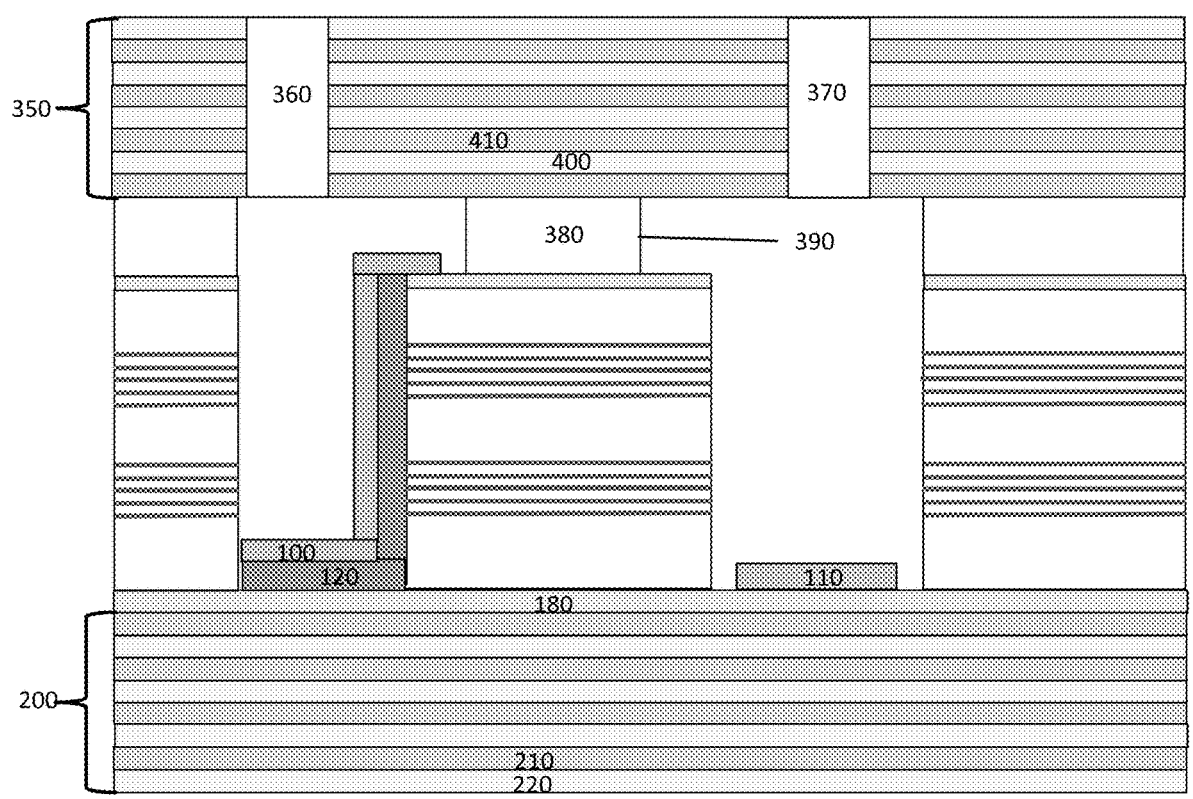
FIG. 9 shows a cross-sectional view of an electrically pumped vertical cavity laser with wafer bonded GaAs/AlGaAs top mirror with injection contacts recessed below the bonded interface.

FIG. 9 illustrates another preferred embodiment of an electrically pumped VCL according to the present invention. This embodiment employs a top wafer bonded GaAs/AlGaAs mirror 350 comprising alternating GaAs (410) and AlGaAs (400) layers, in addition to the bottom wafer bonded mirror 200. Bonding to the top surface is enabled by maintaining as planar a surface as possible, and recessing first and second injection contacts 100 and 110 below the bonding surface, which is guaranteed by inclusion of a bonding spacer layer 380, comprising a central portion 390, which is preferably GaSb capped with InAsSb. Note the contacts 100 and 110 are deposited before the top mirror is bonded. The spacer layer 380 is preferably half wavelength in the material in thickness, or about 0.44 um, providing adequate space to recess metal contacts. The central portion 390 can function as the refractive index guide, but its thickness is greater than desirable for low-loss guiding. An additional shallow etch could be included as in embodiments already described to further reduce losses. Etched vias 360 and 370 enable access to contacts 100 and 110 after bonding the top mirror.

Figure 10:
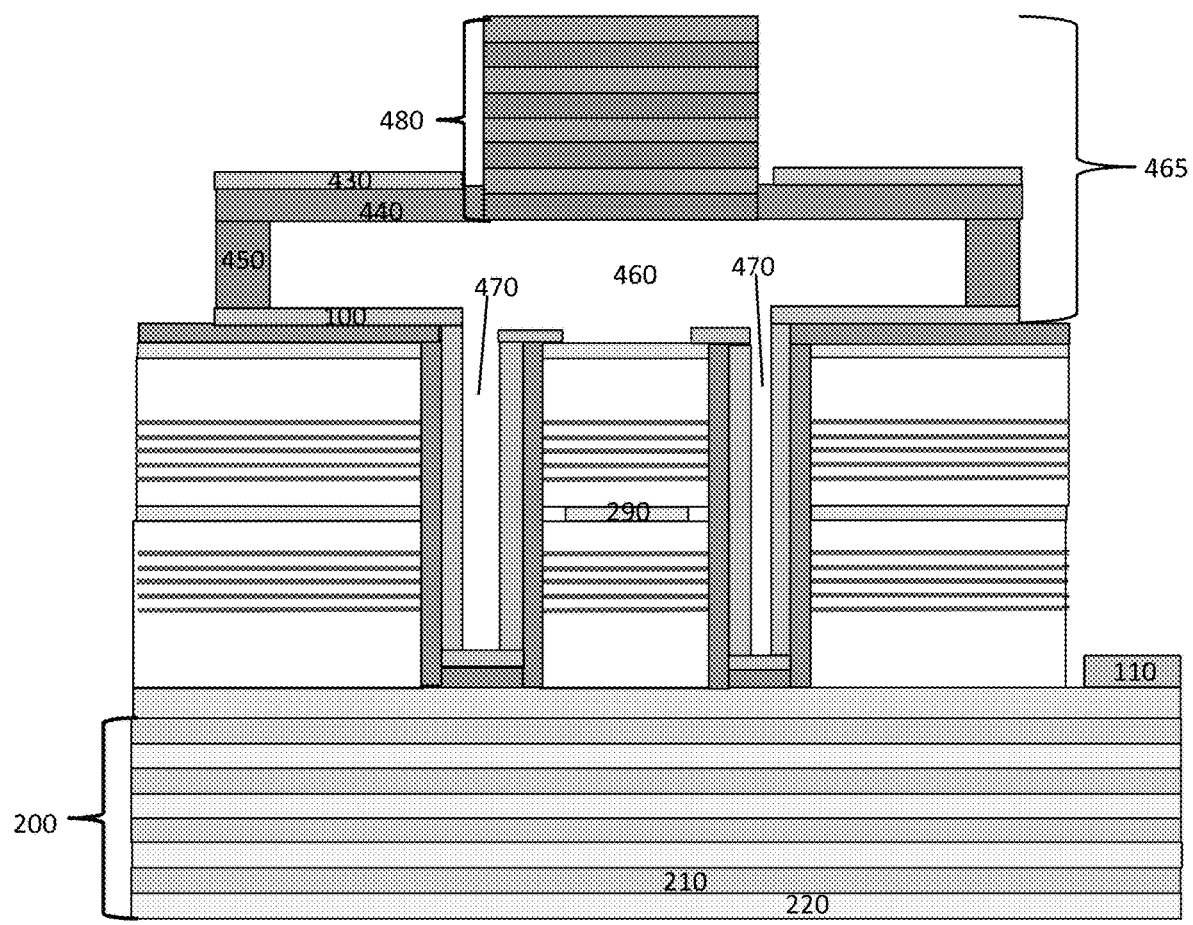
FIG. 10 shows a cross-sectional view of an electrically pumped MEMS-tunable VCL, with MEMS actuator on a non-planar surface, in accordance with the present invention.
Figure 11:
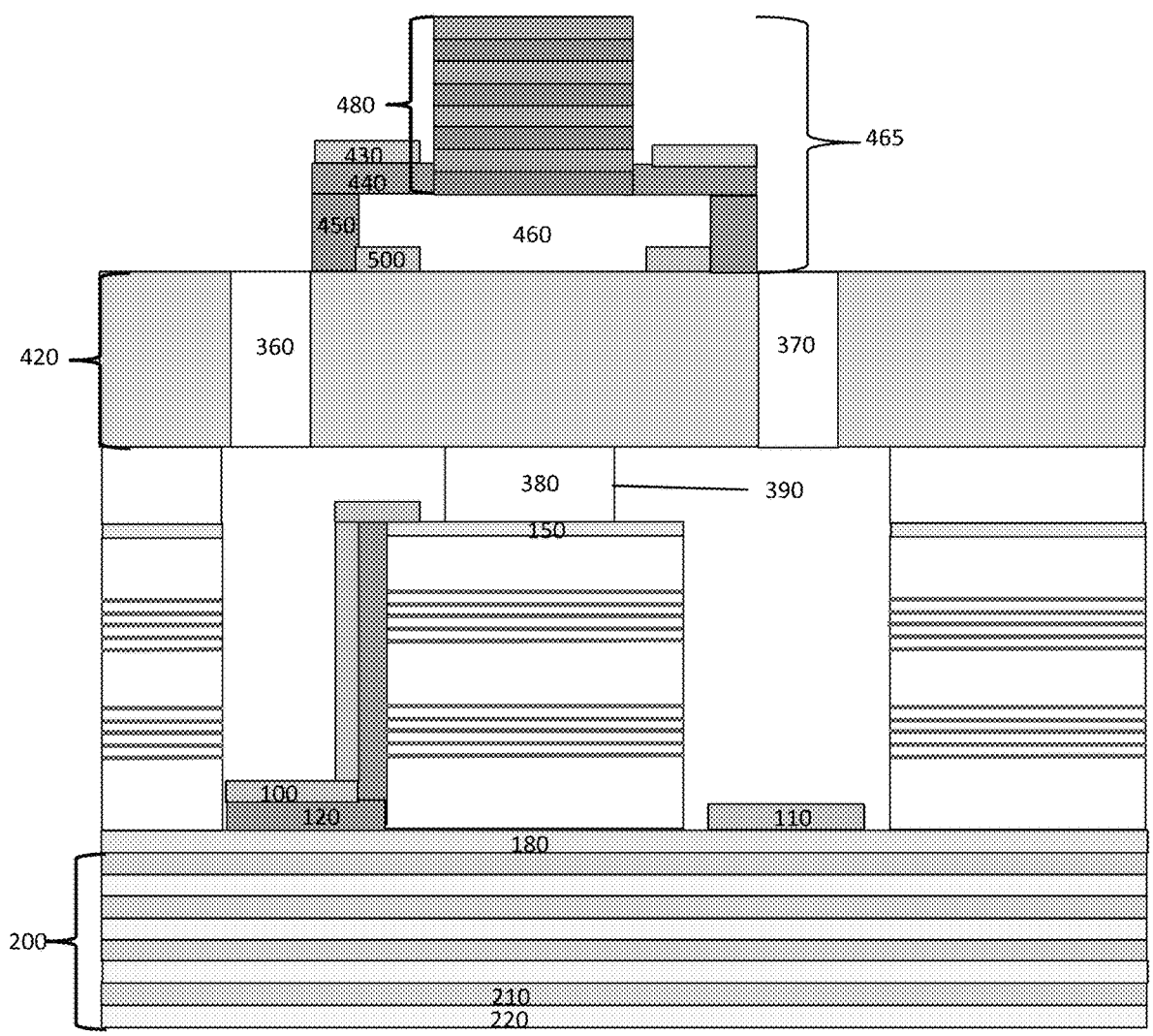
FIG. 11 shows a cross-sectional view of an electrically pumped MEMS-tunable VCL, with MEMS actuator disposed on a planar bonded heat sunk layer, in accordance with the present invention.

FIGS. 10 and 11 show MEMS-tunable embodiments of an electrically pumped VCL according to the present invention. In FIG. 10, the top injection contact 100 is routed back to the surface of the wafer where it can double as the bottom contact of a MEMS actuator 465, which comprises an adjustable airgap 460, a flexible silicon nitride membrane 440 supported at the edges by a Germanium standoff 450, a suspended top mirror 480, and a top MEMS contact 430. Application of a voltage between contacts 430 and 100 creates an electrostatic force that contracts the airgap, causing tuning of the VCL to shorter wavelengths. Note the MEMS structure is built on a non-planar surface including an annular trench 470. This non-planarity can propagate to create kinks in the membrane 440, but the annular trench 470 can also be backfilled and planarized before MEMS fabrication, as is well known to those skilled in the art of semiconductor fabrication. In the preferred embodiment, the top mirror 480 would be curved by structuring a sacrificial layer (preferably Germanium) on which the mirror is deposited, before removing the sacrificial layer to release the membrane. This would provide modal confinement of the MEMS-tunable VCL structure. The fabrication of the MEMS actuator shown in FIGS. 10 and 11 is similar to MEMS actuators in the near-infrared. Key fabrication steps are well-known to those skilled in the art of MEMS-VCSELs, and are described for example in chapter 23 of "Optical Coherence Tomography: Principles and Applications," by Wolfgang Drexler and James Fujimoto, $2^{nd}$ edition, 2015. The nominal width of airgap 460 is 0.6 wavelengths or 1.98 um at zero voltage, and 0.4 wavelengths or 1.32 um at full tuning. The membrane 440 is ideally ¼ wavelength in thickness, making it similar to ¾ wavelength thickness at 1.05 um used at the near infrared. Note in this case the nitride is not in the optical path, and the deposited mirror occupies a gap in the membrane, since at the mid-IR, the SIN may be optically lossy.

FIG. 11 shows a MEMS-tunable embodiment of an electrically pumped VCL according to the present invention, comprising a heat-sinking GaAs layer 420 bonded to the bonding layer 380. This not only provides additional heat sinking to the device, but also planarizes the surface to enable simpler construction of the MEMS actuator 465. Via holes 360 and 370 enable access to the top and bottom injection contacts 100 and 110 as in FIG. 9. In this embodiment, the bottom MEMS contact does not double as the top injection contact, and a separate bottom MEMS contact 500 is required.

Although the MEMS tuning mechanism of FIGS. 10 and 11 provides the widest possible tuning range, alternate tunable structures are possible, such as thermal tuning by an integrated resistive heater, or by variation of injection current.

We note that the various VCL embodiments capable of RTCW operation described by this invention may be employed below room temperature and/or in pulsed mode depending on the application. Such a VCL may still fall under the present invention, since it is capable of RTCW operation.

We also note that the various VCL embodiments presented here can be fabricated in array form to create higher power or multi-wavelength arrays, as has previously been demonstrated in NIR VCSELs.

We also note that in the preferred embodiment, although an ICL gain region based on the GaSb material system is preferred, the use of GaAs/AlGaAs mirrors and low-voltage intra-cavity contacts can also enable alternate embodiment of the gain region. This includes a type I GaSb-based multi-quantum well gain region using InGaAsSb or InAsSb quantum, wells, a type I cascaded GaSb-based gain region, a type II multi-quantum well region in the GaSb material system without a cascaded configuration, or a type II InP-based gain region as described for example in "InP-based type II quantum well Lasers and LEDs," by S. Sprengel, et al, *IEEE Journal of Selected Topics in Quantum Electronics*, vol. 19, no. 4, July/August 2013. Any of these alternate embodiments of the gain region could be inserted into the device embodiments encompassed by FIGS. 2-11.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. An electrically pumped room temperature continuous-wave (RTCW) vertical cavity laser (VCL) having an optical cavity and emitting at an emission wavelength, said VCL comprising a plurality of layers, a multi-layer first mirror, a multi-layer second mirror, an interband cascade gain region, a first n-type charge injection contact, a second n-type charge injection contact, and a refractive index waveguide comprising an inner region of a higher distributed refractive index and an outer region of lower distributed refractive, wherein said higher distributed refractive index exceeds said lower distributed refractive index by less than about 0.12.

2. The VCL of claim 1, wherein a percentage of injected current overlapping with an optical mode is greater than about 25%.

3. The VCL of claim 1, wherein said VCL emits in a single transverse and longitudinal mode.

4. The VCL of claim 1, wherein said refractive index waveguide comprises an undercut layer with an undercut thickness.

5. The VCL of claim 4, wherein said undercut layer comprises at least one material from the group consisting of InAsSb and InAs.

6. The VCL of claim 4, wherein said undercut thickness is less than about a quarter of said emission wavelength divided by refractive index of undercut material.

7. The VCL of claim 1, wherein said refractive index waveguide comprises an oxidized layer of AlGaAs having an oxide thickness.

8. The VCL of claim 7, wherein said oxide thickness is less than about a quarter of said emission wavelength divided by the unoxidized region refractive index.

9. The VCL of claim 7, wherein said oxidized layer comprises a tapered thickness.

10. The VCL of claim 1, wherein said refractive index waveguide comprises a curved surface in said VCL cavity.

11. The VCL of claim 1, wherein said refractive index waveguide comprises a shallow mesa with an etch depth.

12. The VCL of claim 11, wherein said etch depth is less than about a quarter of said emission wavelength divided by a refractive index of the etched material.

13. The VCL of claim 1, wherein a roundtrip loss attributable to a transverse geometry is less than about 0.5%.

14. The VCL of claim 1, wherein a roundtrip loss attributable to a transverse geometry is less than about 0.1%.

15. The VCL of claim 1, wherein at least one of said first and second contacts occupy a tab region adjacent a primary mesa region.

16. The VCL of claim 1, wherein a perimeter of a transverse cross-section of said refractive index waveguide comprises at least one inflection point.

17. The VCL of claim 1, wherein said refractive index waveguide also functions as a current aperture.

18. The VCL of claim 1, wherein at least one of said first and second mirrors includes $Al(x)Ga(1-x)As$, where $0 \leq x \leq 1$.

19. The VCL of claim 1, wherein said interband cascade gain region consists of a first group of active stages separated by at least one spacer layer from a second group of active stages, wherein said first group is aligned with a first standing wave peak in said optical cavity, and said second group is aligned with a second standing wave peak in said optical cavity.

20. The VCL of claim 19, wherein said first group and said second group each comprise 5 active stages for a total of 10 active stages.

21. The VCL of claim 1, comprising more than 5 active stages substantially aligned with a single optical standing wave peak.

22. The VCL of claim 21, comprising exactly 7 active stages.

23. The VCL of claim 1, wherein a current injection path between said first and second injection contacts does not pass through any layers of said first and second multi-layer mirrors.

24. The VCL of claim 1, wherein both said first mirror and said second mirror are comprised of alternating layers of $Al(x1)Ga(1-x1)As$ and $Al(x2)Ga(1-x2)As$, and $0 \leq x1, x2 \leq 1$ and $x1 \neq x2$.

25. The VCL of claim 1, wherein exactly one of said first mirror and said second mirror is comprised of alternating layers of $Al(x1)Ga(1-x1)As$ and $Al(x2)Ga(1-x2)As$, and $0 \leq x1, x2 \leq 1$ and $x1 \neq x2$.

26. The VCL of claim 1, wherein at least one of said first mirror and said second mirror includes at least one material from the group consisting of Ge, ZnS, ZnSe, and ThF4.

27. The VCL of claim 1, further comprising a mechanism for tuning said emission wavelength to create a tunable emission over a wavelength tuning range.

28. The VCL of claim 27, wherein said tuning mechanism comprises thermal tuning.

29. The VCL of claim 28, wherein said thermal tuning is accomplished by changing an injection current into said VCL.

30. The VCL of claim 27, wherein said tuning mechanism comprises a MEMS tuning structure to change a dimension of an airgap by moving a position of at least one of said first and second mirrors.

31. The VCL of claim 27, wherein said first mirror is a fixed mirror comprising $Al(x)Ga(1-x)As$, with $0 \leq x \leq 1$, and said second mirror is a deposited mirror disposed on a flexible membrane and separated from said gain region by an airgap.

32. The VCL of claim 1, wherein at least one of said first and second mirrors is suspended on a flexible membrane and can be moved by a MEMS actuation mechanism to produce a tunable output radiation.

33. The VCL of claim 1, wherein said emission wavelength is in a range of about 3-7 um.

34. The VCL of claim 1, wherein at least one of said first and second mirrors includes Gallium and Antimony.

35. The VCL of claim 1, further comprising a wafer-bonded interface between said gain region and at least one of said first and second mirrors.

36. The VCL of claim 1, wherein a near field spot size of said VCL emission is in a range of about 4-9 times said emission wavelength.

37. A system for optical spectroscopy configured to probe a property of a sample, the system comprising a tunable laser emitting a tunable emission over a wavelength tuning range, said tunable emission transmitted through, reflected from, or backscattered from said sample, an optical detector for detecting a wavelength dependence of said transmitted, backscattered, or reflected tunable laser emission across said wavelength tuning range, and a processor configured to convert said wavelength dependence to a property of said sample, wherein said tunable laser is the VCL of claim 27.

38. The system of claim 37, wherein said sample is a gas.

39. The system of claim 38, wherein said gas comprises at least one gas from the group consisting of methane, ethane, ammonia, carbon dioxide, water vapor, HF vapor, nitrous oxide, acetylene, carbonyl sulfide, dimethyl sulfide, hydrogen cyanide, and carbon monoxide.

40. The system of claim 39, wherein said property is a gas concentration.

41. An electrically pumped room temperature continuous-wave (RTCW) vertical cavity laser (VCL) having an optical cavity and emitting at an emission wavelength, said VCL comprising a plurality of layers, a multi-layer first mirror, a multi-layer second mirror, an interband cascade gain region, a first n-type charge injection contact, and a second n-type charge injection contact, wherein a current injection path between said first and second injection contacts does not travel through any layers of said first and second mirrors.

42. The VCL of claim 41, further comprising a refractive index waveguide comprising an inner region of a higher distributed refractive index and an outer region of lower distributed refractive, wherein said higher distributed refractive index exceeds said lower distributed refractive index by less than about 0.12.

43. The VCL of claim 41, wherein both said first mirror and said second mirror are comprised of alternating layers of $Al(x1)Ga(1-x1)As$ and $Al(x2)Ga(1-x2)As$, and $0 \le x1, x2 \le 1$ and $x1 \ne x2$.

44. The VCL of claim 41, wherein exactly one of said first mirror and said second mirror is comprised of alternating layers of $Al(x1)Ga(1-x1)As$ and $Al(x2)Ga(1-x2)As$, and $0 \le x1, x2 \le 1$ and $x1 \ne x2$.

45. The VCL of claim 41, further comprising a mechanism for tuning said emission wavelength to create a tunable emission over a wavelength tuning range.

46. The VCL of claim 45, wherein said tuning mechanism comprises thermal tuning.

47. The VCL of claim 45, wherein said tuning mechanism comprises a MEMS tuning structure to change a dimension of an airgap by moving a position of at least one of said first and second mirrors.

48. The VCL of claim 45, wherein said first mirror is a fixed mirror comprising $Al(x)Ga(1-x)As$, with $0 \le x \le 1$, and said second mirror is a deposited mirror disposed on a flexible membrane and separated from said gain region by an airgap.

49. The VCL of claim 41, wherein at least one of said first and second mirrors is suspended on a flexible membrane and can be moved by a MEMS actuation mechanism to produce a tunable output radiation.

50. The VCL of claim 41, wherein said emission wavelength is in a range of about 3-7 um.

51. The VCL of claim 41, wherein at least one of said first and second mirrors includes Gallium and Antimony.

52. An electrically pumped room temperature continuous-wave (RTCW) vertical cavity laser (VCL) having an optical cavity and emitting at an emission wavelength, said VCL comprising a plurality of layers, a multi-layer first mirror, a multi-layer second mirror, a gain region which comprises at least one gain type from the group consisting of a type I GaSb-based multi-quantum well, type I GaSb-based cascaded quantum wells, a type II GaSb-based multi-quantum well, and a type II InP-based multi-quantum well, said VCL further comprising a first n-type charge injection contact, a second n-type charge injection contact, and a refractive index waveguide comprising an inner region of a higher distributed refractive index and an outer region of lower distributed refractive index, wherein said higher distributed refractive index exceeds said lower distributed refractive index by less than about 0.12.

53. The VCL of claim 52, wherein a current injection path between said first and second injection contacts does not pass through any layers of said first and second mirrors.

54. The VCL of claim 52, wherein at least one of said first and second mirrors comprises $Al(x)Ga(1-x)As$, where $0 \le x \le 1$.

* * * * *